United States Patent
Guyette et al.

(10) Patent No.: US 10,079,414 B2
(45) Date of Patent: Sep. 18, 2018

(54) SWITCHED MULTIPLEXER WITH FLAT GROUP DELAY AND CHANNELIZED LIMITING

(71) Applicant: The United States of America, as represented by the Secretary of the Navy, Washington, DC (US)

(72) Inventors: Andrew C. Guyette, Alexandria, VA (US); Eric J. Naglich, Alexandria, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 155 days.

(21) Appl. No.: 15/073,170

(22) Filed: Mar. 17, 2016

(65) Prior Publication Data

US 2016/0277001 A1  Sep. 22, 2016

Related U.S. Application Data

(60) Provisional application No. 62/134,468, filed on Mar. 17, 2015, provisional application No. 62/309,207, filed on Mar. 16, 2016.

(51) Int. Cl.
| | | |
|---|---|---|
| H01P 1/10 | (2006.01) | |
| H01P 1/213 | (2006.01) | |
| H03H 7/01 | (2006.01) | |
| H03H 7/46 | (2006.01) | |
| H01P 1/15 | (2006.01) | |

(52) U.S. Cl.
CPC ............ *H01P 1/10* (2013.01); *H01P 1/15* (2013.01); *H01P 1/213* (2013.01); *H03H 7/0138* (2013.01); *H03H 7/0153* (2013.01); *H03H 7/46* (2013.01)

(58) Field of Classification Search
CPC .. H01P 1/10; H01P 1/213; H03H 7/46; H03H 7/0138; H03H 7/0153
USPC .............. 333/101, 104, 134, 174, 175
See application file for complete search history.

(56) References Cited

U.S. PATENT DOCUMENTS 4,571,560 A * 2/1986 Dobrovolny ............ H03H 7/00
333/174

* cited by examiner

*Primary Examiner* — Rakesh Patel
(74) *Attorney, Agent, or Firm* — US Naval Research Laboratory; William P. Ladd

(57) ABSTRACT

Systems and method are provided for a switching circuit that enables attenuation of high power signals in relatively small band(s) without attenuating information in other bands. Embodiments of the present disclosure provide switching circuits with intrinsically switched filters that enable channelized limiting without affecting adjacent channels. Further, embodiments of the present disclosure provide a unique filter coupling topology that enables filters to be switched on or off without changing the input impedance of the filters.

20 Claims, 5 Drawing Sheets

SWITCHED MULTIPLEXER WITH FLAT GROUP DELAY AND CHANNELIZED LIMITING

CROSS REFERENCE TO RELATED APPLICATIONS

This application claims the benefit of U.S. Provisional Patent Application No. 62/134,468, filed on Mar. 17, 2015, and U.S. Provisional Patent Application No. 62/309,207, filed on Mar. 16, 2016, both of which are incorporated by reference herein in their entireties.

FIELD OF THE DISCLOSURE

This disclosure relates to switching circuits, including switching circuits for selecting filters.

BACKGROUND

Limiters can be used to prevent damage caused to circuits, such as microwave circuits. For example, if a receiver is very sensitive to what it can hear far away, it can be easily damaged by high power signals. Limiters can prevent sensitive circuitry from high power signals by, for example, attenuating high power signals to prevent this damage. Currently, many limiters are wide bandwidth, so if a very narrow band high power signals is received, many conventional limiters attenuate all signals that are received by a circuit, and no information (in any frequency) is received after this attenuation.

Switched multiplexers can be used in radio frequency (RF) and microwave systems to separate and re-join frequency bands for more-optimal analysis of signals. Their switching capability can allow the selection of which bands will be passed and which bands to be highly attenuated. Three of the most important performance metrics for switched multiplexers are insertion loss, group delay ripple, and high power signal limiting capability.

Switched multiplexers are typically implemented by splitting the input signal into even- and odd-numbered channels (which gives an inherent architecture loss) or with the use of nonreciprocal devices such as amplifiers (which adds noise to the circuit) to prevent the switching of channels from affecting the response of adjacent channels. In passive switched multiplexer designs without amplifiers, the architecture-related loss and the dissipative losses of the couplers, switches, and power dividers often results in passband insertion losses greater than 10 dB. The group-delay ripple in conventional switched multiplexers tends to be quite high, even in so-called flat group-delay designs.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 1 a diagram of a switching circuit according to an embodiment of the present disclosure;

Figure 1:
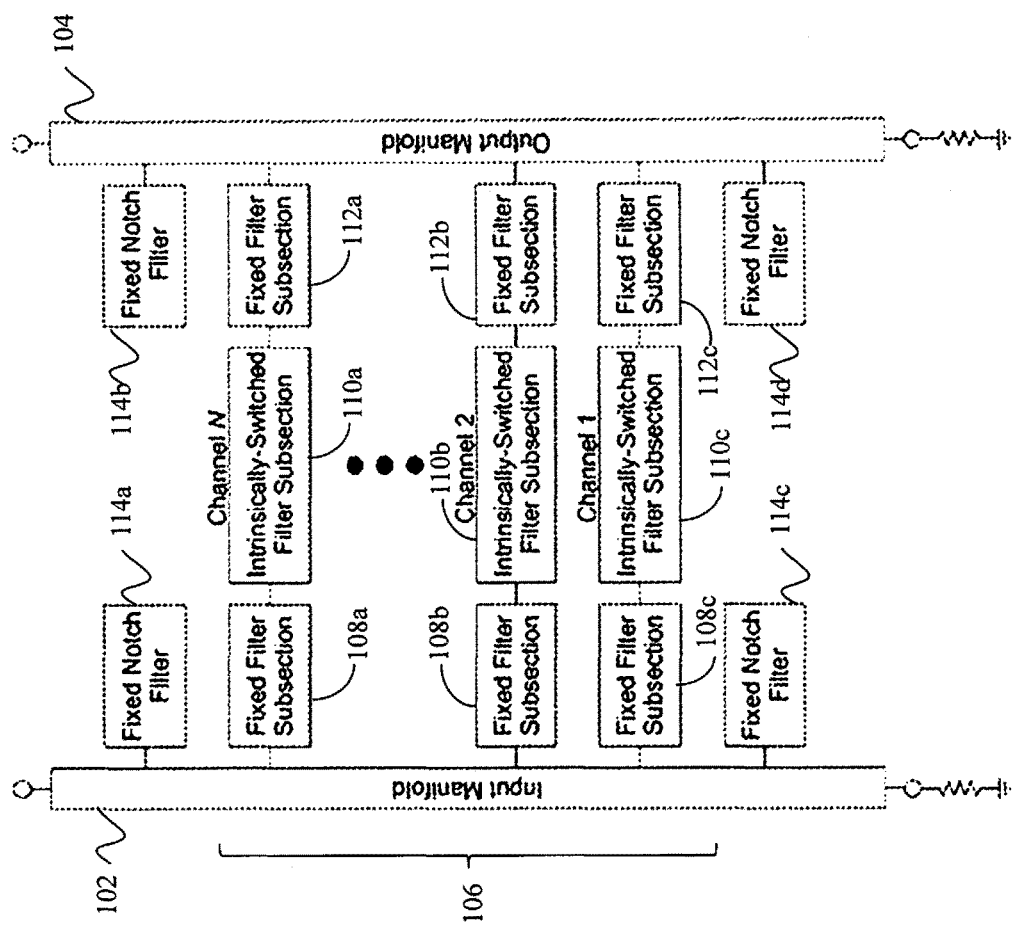

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. Overview

Embodiments of the present disclosure provide systems and methods that enable attenuation of high power signals in relatively small band(s) without attenuating information in other bands, thus allowing this information to be received and processed. The architecture provided by embodiments of the present disclosure does not require non-reciprocal devices, such as amplifiers, and also does not have any substantial inherent architecture loss. The architecture according to embodiments of the present disclosure is designed such that its response when all bandpass filters are switched on mimics that of an ideal transmission line over the coverage range of the multiplexer. An ideal transmission line has flat amplitude and group delay response over all frequencies. Embodiments of the present disclosure enable channelized limiting without affecting adjacent channels. Therefore, high power signals will automatically turn a channel off and be highly attenuated, while low power signals will be passed with low attenuation in adjacent bands.

For example, systems and methods according to embodiments of the present disclosure enable switching filters (e.g., in a filter bank) using intrinsic switching elements that cancel out couplings that exist between resonators and filters. In conventional switching circuits, it is difficult to switch together adjacent channels without an undesirably large degree of insertion loss. Additionally, in many conventional switching circuits, when circuity for a channel is switched on or off, the input impedance seen by other switching circuits changes as a result, especially when frequency bands are adjacent. Embodiments of the present disclosure provide a unique filter coupling topology that enables filters to be switched on or off without changing the input impedance of the filters. In other words, filters look the same to other filters regardless of whether a particular filter is switched on or off. For example, internal intrinsically switched filter subsections can be used to cancel out couplings inside that filter, allowing the change in impedance that other filters in the filter bank "see" to be minimized.

This minimization in the change in input impedance is especially important with respect to adjacent channels, as switching filters for adjacent channels using conventional circuits usually results in a large amount of loss. Systems and methods according to embodiments of the present disclosure provide a means of implementing contiguous-channel bandpass multiplexers that have flat group delay across the entire passband, especially including the crossover regions between channels and channelized limiting capability with minimal degradation of adjacent channels. Channelized limiting allows high power signals to be strongly attenuated while minimally affecting low power signals in adjacent channels. Embodiments of the present disclosure provide intrinsically-switchable filters in a resistively-terminated manifold structure whose composite response is designed to be that of an ideal all-pass transmission line when all of the filters are in their "on" state.

2. Intrinsically Switched Filters

FIG. 1 is a diagram of a switching circuit according to an embodiment of the present disclosure. In FIG. 1, filter circuitry 106 for respective filter channels (e.g., channels 1 through N) is coupled between an input manifold 102 and an output manifold 104. For example, in an embodiment, fixed filter subsection 108c, intrinsically-switched filter subsection 110c, and fixed filter subsection 112c are used to filter signals in a frequency band used by Channel 1, fixed filter subsection 108b, intrinsically-switched filter subsection 110b, and fixed filter subsection 112b are used to filter signals in a frequency band used by Channel 2, and fixed filter subsection 108a, intrinsically-switched filter subsection 110a and fixed filter subsection 112a are used to filter signals in a frequency band used by Channel N. For each respective channel, filter circuitry 106 contains an intrinsically switched filter subsection 110 coupled between a first fixed filter subsection 108 and a second fixed filter subsection 112. In an embodiment, a plurality of fixed filter notches 114 can also be coupled above and below filter circuitry 106.

In an embodiment, the composite structure of FIG. 1 is designed such that the pass bands of the channel filters gracefully merge together when they are all on, creating flat amplitude and group delay responses. When a channel is switched off, the exterior, fixed filter subsections 108 and 112 in the channel remain coupled to input manifold 102 and output manifold 104 while the signal path through the channel filter is removed. Fixed filter subsections 108 and 112 provide a bandstop response when a channel is switched off, increasing the isolation into the switched-off channel.

In an embodiment, intrinsic switching is accomplished using intrinsically switched filter subsections 110. In accordance with embodiments of the present disclosure, each intrinsically switched filter subsection 110 can be switched on or off (e.g., to enable or disable filtering of respective channels 1-N) without substantially changing the input impedance seen by filter circuitry 106 for any of the other filters. In an embodiment, each intrinsically switched filter subsection 110 contains circuitry configured to cancel out couplings (e.g., electric and magnetic inter-resonator couplings within respective bandpass filters inside each intrinsically switched filter subsection 110) to realize the off state when each intrinsically switched filter subsection 110 is switched off, allowing impedance that other filters in filter circuitry 106 "see" to be minimized. For example, in an embodiment, the return loss experienced by circuitry for adjacent channels (e.g., the amount of signal reflected when intrinsically switched filter subsections 110 are switched on or off) is 15 dB or less. These intrinsically switched filter subsections 110 advantageously provide high broadband off-state isolation and low on-state passband insertion loss (e.g., around 2 dB of insertion loss and 0.7 ns p-p group delay ripple over 72% of the passband).

3. Intrinsically Switched Coupling Section

Figure 2:
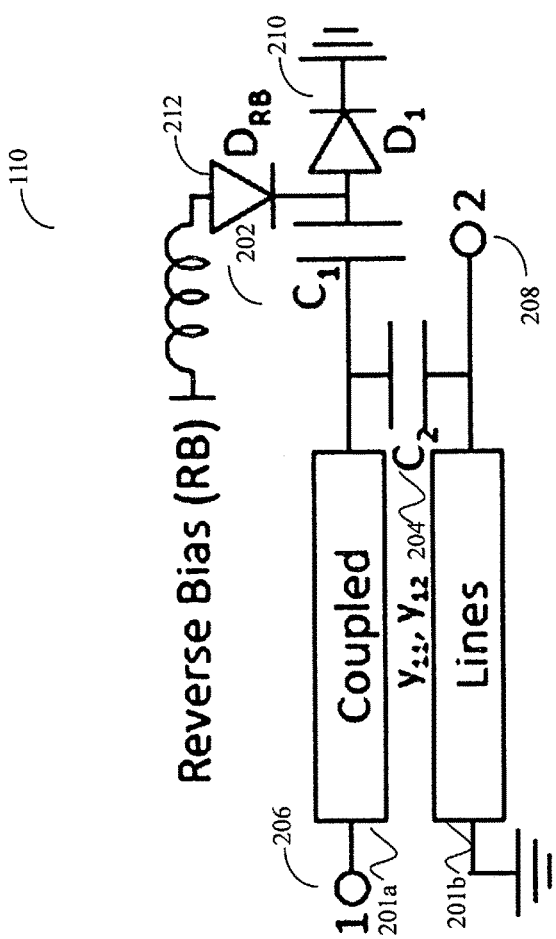
FIG. 2 is a diagram of an exemplary embodiment of an intrinsically switched filter subsection using an intrinsically switching coupling section.
Figure 3:
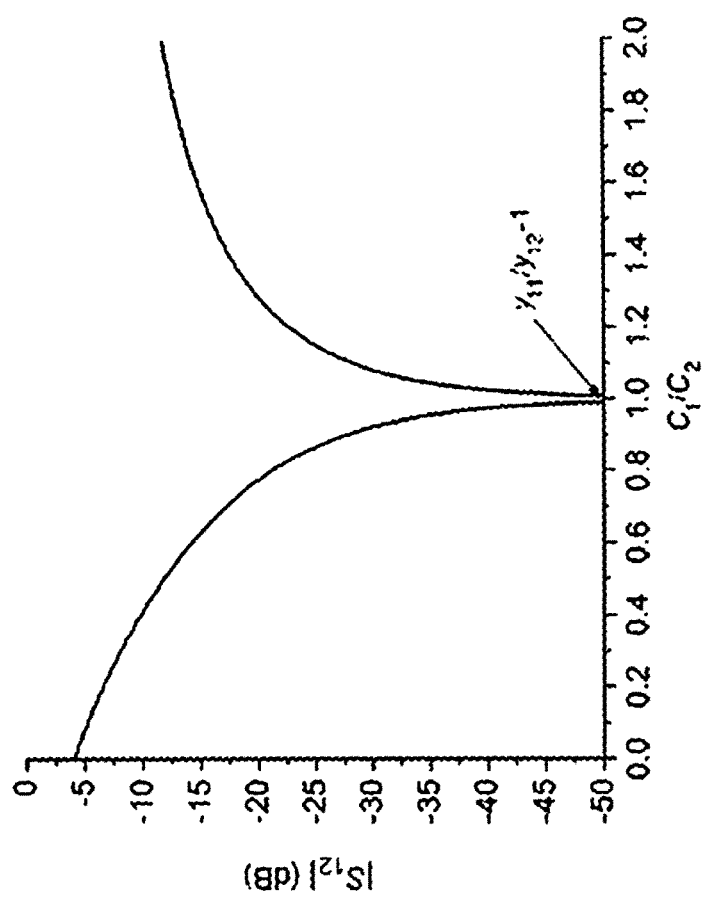
FIG. 3 is an exemplary plot of an isolation between two ports for a given set of coupled transmission lines according to an embodiment of the present disclosure.

FIG. 2 is a diagram of an exemplary embodiment of an intrinsically switched filter subsection 110 using an intrinsically switching coupling section. In an embodiment, the intrinsically switched coupling section of FIG. 2 comprises two coupled lines 201, an adjustable capacitance $C_1$ 202, and a fixed capacitance $C_2$ 204. In an embodiment, this coupling section has a unique property that enables it to provide wideband, frequency-independent isolation that is dependent on the ratio of the capacitances ($C_1$ 202 and $C_2$ 204) and transmission line parameters ($y_{11}$ and $y_{12}$) in the circuit of FIG. 2. In an embodiment, transmission line parameters ($y_{11}$ and $y_{12}$) are admittance parameters of coupled lines 201. FIG. 3 shows an example plot of isolation between port-1 206 and port-2 208 for a given set of coupled transmission lines. Specifically, FIG. 3 is a plot of the transfer function $S_{12}$ of the circuit of FIG. 2 versus $C_1/C_2$. The plot of FIG. 3 shows that the frequency-independent isolation varies significantly as a function of the ratio of the capacitances ($C_1$ 202 and $C_2$ 204).

To provide channelized limiting capability, a power-dependent switch, such as a PIN diode 210, can be placed in series with $C_1$ 202. In an embodiment, a reverse bias diode 212 can also be added (e.g., to prevent harm to the rest of the control network). The off-state capacitance can be designed into the filter in the on state such that the total capacitance of the series combination of $C_1$ 202 and the switch capacitance provides a desired amount of coupling through the intrinsically switchable coupling section shown by FIG. 2. When the switch is activated by power, the capacitance $C_1$ 202 of this branch changes. The new capacitance $C_1$ 202 can be designed such that its ratio with $C_2$ 204 provides high isolation in the intrinsically switchable coupling section of FIG. 2. Therefore, the channel can be switched out of the circuit, and power-dependent limiting is provided.

For example, in an embodiment, the off-state condition for the intrinsically switched coupling section shown in FIG. 2 is given by $C_1/C_2 = y_{11}/y_{12}-1$. Under this condition, the transfer function $S_{12}$ is equal to zero for all frequencies, and thus the circuit of FIG. 2 becomes a perfect all-stop network. Since the strength of inter-resonator couplings determines the passband bandwidth of a filter, for narrow bandwidths less change in $C_1$ 202 is needed for intrinsic switching. If $C_1$ 202 and $C_2$ 204 are replaced with generalized admittances $Y_1$ and $Y_2$, respectively, the perfect all-stop condition becomes $Y_1/Y_2 = y_{11}/y_{12}-1$. This indicates that if $C_1$ 202 and $C_2$ 204 are nonideal capacitances with parasitics and finite loss, a perfect all-stop condition can still be achieved, as long as the parasitics and losses are balanced.

4. Channel Filter Design and Combining Networks

Embodiments of the present disclosure provide a design approach that allows for a flat group delay across contiguous switched-on filter channels. For example, in an embodiment, odd-order channel filters of order N with N−3 complex transmission zeroes are an optimum solution in regards to both off-state isolation and filter topology simplicity. In an embodiment, the transversal coupling matrix of an ideal intrinsically switched multiplexer response with all channels switched on can be first derived and then partitioned by frequency into groups of N transversally coupled resonators to form Nth-order channel filters. These channel filters can then be transformed into more practical networks using techniques such as similarity transforms. Partitioning the overall transversal coupling matrix such that adjacent channel filters "share" resonances results in channel filters with greatly simplified coupling topologies, as well as improved channel selectivity. To connect the channel filters together in parallel, lossy manifolds, which are transmission-line manifolds terminated in a resistive load rather than an open or a short, are a practical scalable solution. Spacing the channel filters appropriately along the manifold allows the filters to work together to shield one another from the resistive load, thus minimizing any added loss.

Embodiments of the present disclosure provide systems and methods for addressing the problem of how to design contiguous bandpass channel filters so that they can be combined to form a single bandpass response with flat passband insertion loss and group delay. For example, an embodiment of the present disclosure uses channel filters with topologies that are capable of realizing a specific number of complex transmission zeroes and overlaps the band edges in such a way that resonances are shared between adjacent channel filters.

In an embodiment, the procedure begins with deriving the equivalent infinite-order transversal coupling matrix of a well-matched transmission line. This transversal coupling matrix is then partitioned into Nth-order channel filters, and the channel coupling topologies are simplified (e.g., using standard techniques). Channel filters can be switched without significantly disrupting the response of adjacent channels if the input/output couplings and resonators are left unchanged with switching. Finally, lossy manifolds can be used to allow for an arbitrary number of channel filters to be connected in parallel to form an intrinsically switched multiplexer.

In an embodiment, synthesis of the equivalent infinite-order transversal coupling network is accomplished by finding the residues and eigenvalues of the even and odd-mode admittances, from which the couplings and shunt susceptances can be calculated. The eigenvalues $\lambda$ are the values of the complex frequency variable corresponding to the poles of the even and odd-mode admittances, and Res are the residues of these poles. For a transmission line of electrical length $\theta$ and characterical admittance Y1, the couplings $K_1$ are then given by $\sqrt{Res/2} = \sqrt{Y1/a}$ where a is the phase delay. The shunt susceptances $B_k$ are given by by $\lambda/j = k\lambda/a$. A transmission line may therefore be modeled as an infinite array of transversally, coupled resonators equally spaced in resonant frequency with equal-magnitude couplings.

The infinite-order transversal resonator array may be partitioned by frequency into groups of transversal resonators to form channel filters. These channel filters would then be guaranteed to merge gracefully into a continuous passband response. Techniques such as coupling matrix rotations can then be used to transform these channel filters into more practical networks. Since the resonators are spaced equally in frequency, these channel filters will have equal absolute bandwidths. In an embodiment, there are essentially two ways to partition the infinite-order transversal resonator array: it can be partitioned into integral numbers of transversal resonator networks, or some of the transversal resonators can be "split" such that they are shared between adjacent pairs of channel filters. These two partitioning approaches result in significantly different channel filter topologies.

Consider an Nth-order channel filter prototype constructed from a group of N transversal resonators. To simplify analysis, it is convenient to shift the resonator resonant frequencies such that the resonant frequency distribution is symmetric about the origin. The form of the resulting transfer function determines the possible topologies that the group of transversal resonator networks can be transformed into; in general, the fewer transmission zeroes, the less complex the filter topology required. The number and locations of the transmission zeroes contained in the numerator of the transfer function of a channel filter determines the filter topologies that can be used to realize a channel filter.

One approach to switching a channel filter off without significantly affecting nearby channels is to leave the input and output resonators and their couplings to the input and output unchanged. The channel filters can be connected in parallel to the same input/output nodes. The goal is to realize this architecture in a way that is practical and scalable. If the number of channels is small, almost any multiplexer architecture could be used to connect the filters together at the input and output. For example, star junctions are relatively simple to design and implement, but quickly become impractical as the number of channel filters is increased. Lossless transmission-line manifold approaches allow for more channels, but are still limited by in-band manifold resonances, which become a problem as filters are added and the manifolds becomes electrically large. However, lossy transmission line manifolds that, instead of being terminated in an open or short are terminated in a resistive load, do not suffer from manifold resonances.

To minimize in-band power lost to the resistive terminations, the channel filters are arranged descending in center frequency from the input toward the terminations. Under this arrangement, for a given in-band frequency of channel filter N, the input impedances of the higher frequency filters are predominately capacitive, and the input impedances of the lower frequency filters are inductive. The out-of-band impedances of the higher frequency filters, together with the lengths of transmission line between adjacent filters, effectively form a low-pass filter that serves as a matching network to channel filter N, and can also serve to suppress unwanted higher order spurious modes. Conversely, the out-of-band impedances of the lower frequency filters along with the transmission-line lengths form a high-pass filter that shields filter N from the resistive load. The design process can be simplified for large numbers of channels with the use of log-periodic techniques.

Figure 4:
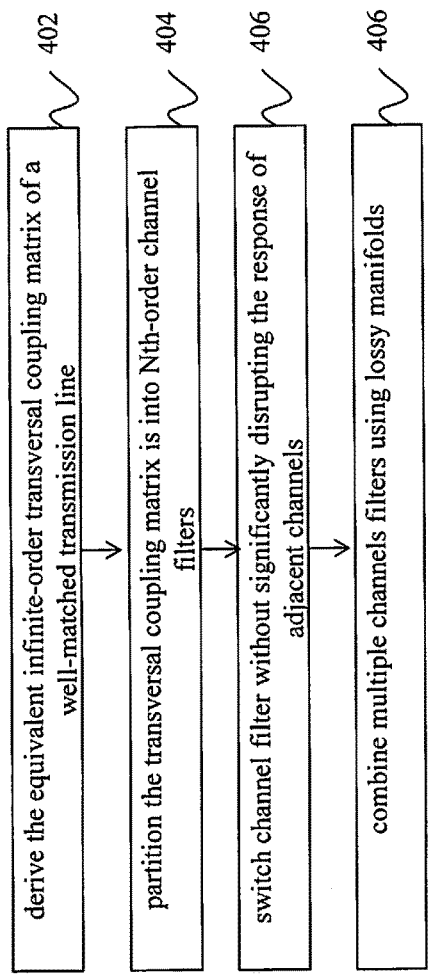
FIG. 4 is a flowchart of a method for designing contiguous bandpass channel filters so that they can be combined to form a single bandpass response with flat passband insertion loss and group delay in accordance with an embodiment of the present disclosure.

FIG. 4 is a flowchart of a method for designing contiguous bandpass channel filters so that they can be combined to form a single bandpass response with flat passband insertion loss and group delay in accordance with an embodiment of the present disclosure. In step 402, the equivalent infinite-order transversal coupling matrix of a well-matched transmission line is derived. In step 404, this transversal coupling matrix is then partitioned into Nth-order channel filters, and the channel coupling topologies are simplified (e.g., using standard techniques). In step 406, channel filters are switched without significantly disrupting the response of adjacent channels. In step 408, multiple channels filters are combined using lossy manifolds.

5. Power-Dependent Coupling Elements

Embodiments of the present disclosure provide systems and methods for incorporating limiter functionality into the design of a component that is inherently frequency selective, such as filters and multiplexers. Embodiments of the present disclosure provide limiter topologies that enable channelized, frequency-selective limiting without requiring non-reciprocal components, parametric circuits, or magnetic materials. In an embodiment, the inter-resonator coupling in the channel filters of the topology of FIG. 1 becomes dependent on power level, providing very low coupling between resonators when high-power signal(s) are present.

Figure 5:
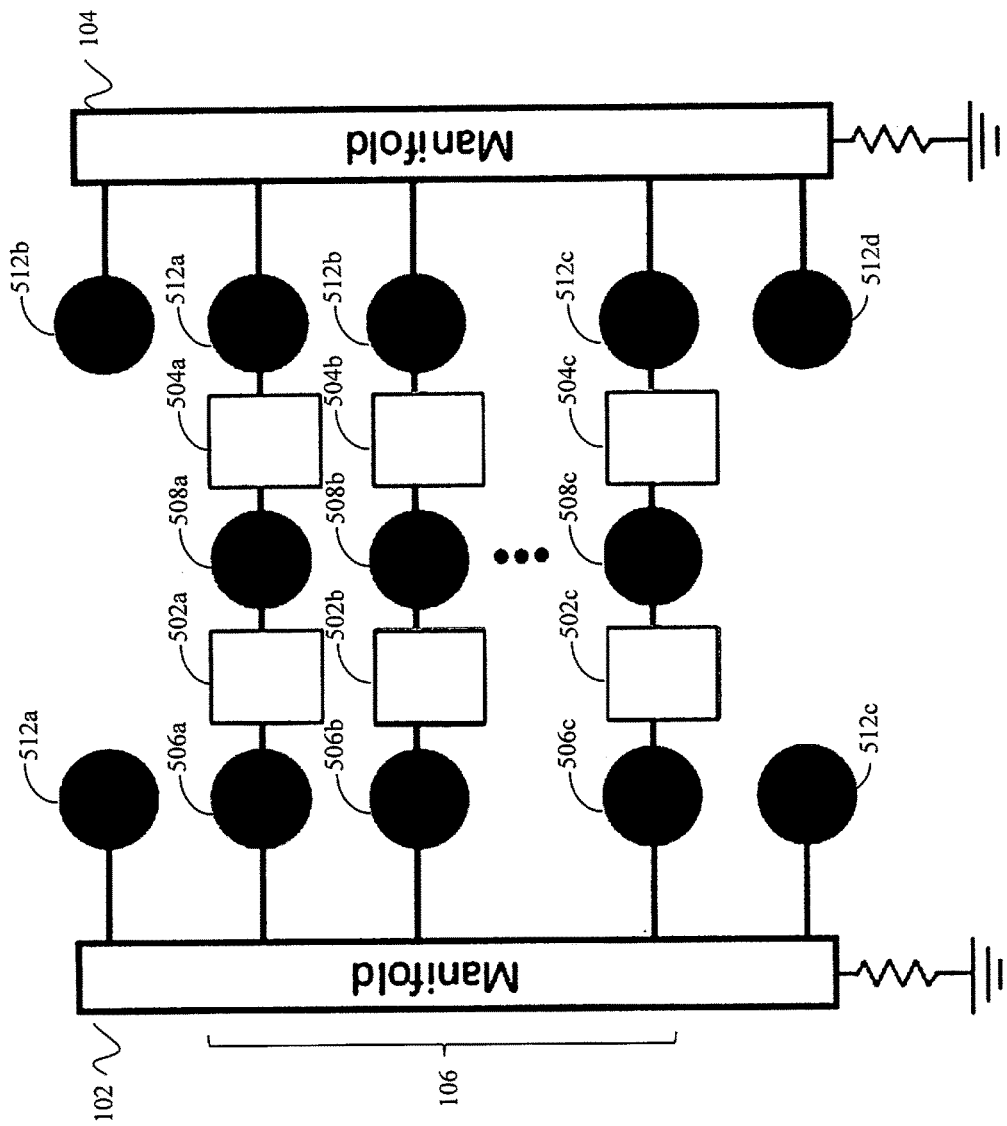
FIG. 5 is a diagram of a switching circuit using power-dependent coupling elements according to an embodiment of the present disclosure.

FIG. 5 is a diagram of a switching circuit using power-dependent coupling elements according to an embodiment of the present disclosure. In FIG. 5, resonators 506 include circuitry for fixed filter subsections 108, resonators 508 include circuity for intrinsically switched filter subsections 110, resonators 510 include circuitry for fixed filter subsections 112, and resonators 512 include circuitry for fixed filter notches 114. In an embodiment, resonators 508 include circuitry for intrinsically switched filter subsections 110 shown in FIG. 2.

In FIG. 5, power dependent coupling elements 502 and 504 are added to the switching circuit of FIG. 1 to couple between interior resonators of respective channel filters. Specifically, respective power dependent coupling elements 502 are coupled between respective resonators 506 and 508, and respective power dependent coupling elements 502 are coupled between respective resonators 508 and 512. In an embodiment, the first and last resonator of each channel filter (i.e. resonators 506 and 512, respectively) remain coupled to manifolds 102 and 104 when limiting occurs, keeping the channel input impedances approximately constant across all levels of limiting so that adjacent channels are not affected.

In an embodiment, power dependent coupling elements 502 and 504 provide very low coupling between resonators 508 and 508 and 508 and 512, respectively, when high-power signal(s) are present. In an embodiment, the channelized limiting capability of the limiter in FIG. 5 is realized by utilizing the circuit shown in FIG. 2 as an inter-resonator coupling structure between resonators 506 and 508 and 508 and 512. While limiting, the resonators 508 and 512 remain coupled to manifolds 102 and 104, respectively, but become no longer coupled to resonators 508, removing the path through the channel. Resonators 506 and 512 for a particular channel filter dominate the out-of-band input and output impedances of the channel, and because they remain coupled to the manifolds during limiting, the out-of-band input and output impedances of the channel remain approximately constant regardless of input power despite the change in the transmission response between limiting and non-limiting states. The approximately-constant out-of-band input and output impedances enable channelized, frequency-selective limiting that does not disturb adjacent channel passbands with a passive, reciprocal multiplexer structure.

In an embodiment, resonators 508 include circuitry for intrinsically switched filter subsections 110 shown in FIG. 2. If limited PIN diodes with short intrinsic regions and carrier lifetimes are used, moderate RF input power will begin to turn the diodes on after a threshold power is surpassed. This will increase the composite $C_1$ 202 value and move the ratio of $C_1$ 202 to $C_2$ 204, resulting in lower coupling and an off state for the channel filter. In this configuration, coupling through a channel filter becomes dependent on input power. Another advantage of this coupling structure for use in limiters is that the switching diodes 210 and 212 can be significantly decoupled from the circuit, reducing their impact on resonator quality factor and filter linearity.

6. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Any representative signal processing functions described herein can be implemented using computer processors, computer logic, application specific integrated circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g., software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A switching circuit, comprising:
    first filter circuitry configured to filter signals in a first frequency band used by a first channel; and
    second filter circuitry, configured to filter signals in a second frequency band used by a second channel, comprising an intrinsically-switched filter subsection, wherein the intrinsically-switched filter subsection comprises:
        an adjustable capacitor having an adjustable capacitance $C_1$, and
        a fixed capacitor having a fixed capacitance $C_2$, wherein an inter-resonator coupling between resonators of the first filter circuitry and the second filter circuitry is configured to be canceled based on values of $C_1$ and $C_2$ when the intrinsically-switched filter subsection is switched to an off state to disable filtering for the second frequency band.

2. The switching circuit of claim 1, wherein the first frequency band is adjacent to the second frequency band.

3. The switching circuit of claim 1, wherein the intrinsically-switched filter subsection is configured to be switched off without initiating a return loss for the first filter circuitry greater than 15 dB.

4. The switching circuit of claim 1, wherein the second filter circuitry further comprises:
    a first fixed filter subsection coupled to an input circuit and the intrinsically-switched filter subsection; and
    a second fixed filter subsection coupled to an output circuit and the intrinsically-switched filter subsection.

5. The switching circuit of claim 4, wherein the first fixed filter subsection remains coupled to the input circuit when the intrinsically-switched filter subsection is switched off, and wherein the second fixed filter subsection remains coupled to the output circuit when the intrinsically-switched filter subsection is switched off.

6. The switching circuit of claim 4, wherein the first fixed filter subsection and the second fixed filter subsection are configured to provide respective bandstop responses when the intrinsically-switched filter subsection is switched off.

7. The switching circuit of claim 1, wherein the intrinsically-switched filter subsection comprises an intrinsically-switched coupling section.

8. The switching circuit of claim 7, wherein the intrinsically-switched coupling section further comprises a pair of coupled transmission lines.

9. The switching circuit of claim 8, wherein the intrinsically-switched coupling section is configured to provide frequency-independent isolation that is dependent on:
    a ratio of $C_1$ and $C_2$;
    a first transmission line parameter $y_{11}$ of the pair of coupled transmission lines; and
    a second transmission line parameter $y_{12}$ of the pair of coupled transmission lines.

10. The switching circuit of claim 9, wherein the first and second transmission line parameters are admittance parameters of the pair of coupled transmission lines.

11. The switching circuit of claim 9, wherein an off state of the intrinsically-switched coupling section is determined by the equation $C_1/C_2 = y_{11}/y_{12} - 1$.

12. The switching circuit of claim 7, wherein the intrinsically-switched coupling section is configured such that a transfer function of the intrinsically-switched coupling section is equal to zero for all frequencies when the intrinsically-switched coupling section is switched off.

13. The switching circuit of claim 1, wherein the first filter circuitry comprises a second intrinsically-switched coupling section.

14. The switching circuit of claim 1, wherein the intrinsically-switched filter subsection comprises a second inter-resonator coupling between the resonators of the first filter circuitry and the second filter circuitry, the second inter-resonator coupling is configured to be canceled when the second intrinsically-switched filter subsection is switched to the off state to disable filtering for the first frequency band.

15. An intrinsically-switched coupling section of a filter, comprising:
    a pair of coupled transmission lines, comprising:
        a first transmission line, and
        a second transmission line, coupled to the first transmission line, wherein the pair of coupled lines has a first transmission line parameter $y_{11}$ and a second transmission line parameter $y_{12}$;
    an adjustable capacitor having an adjustable capacitance $C_1$; and
    a fixed capacitor having a fixed capacitance $C_2$, wherein an inter-resonator coupling, coupled to the intrinsically-switched coupling section and coupled between resonators of the filter, is configured to be canceled, based on values of $y_{11}$, $y_{12}$, $C_1$, and $C_2$, when the intrinsically-switched coupling section is switched to an off state.

16. The intrinsically-switched coupling section of claim 15, wherein the off state of the intrinsically-switched coupling section is determined based on values of $y_{11}$, $y_{12}$, $C_1$, and $C_2$.

17. The intrinsically-switched coupling section of claim 15, wherein the filter is configured to filter signals in a first frequency band, wherein the intrinsically-switched coupling section is configured such that the intrinsically-switched coupling section is switched to the off state without initiating a return loss greater than 15 dB in a second filter, and wherein the second filter is configured to filter signals in a second frequency band.

18. A filter, comprising:
    a first fixed filter subsection coupled to an input circuit;
    a second fixed filter subsection coupled to an output circuit; and
    an intrinsically-switched filter subsection configured to be coupled to the first fixed filter subsection and the second fixed filter subsection in an on state and to be decoupled from the first fixed filter subsection and the second fixed filter subsection in an off state, wherein the intrinsically-switched filter subsection comprises:
- an adjustable capacitor having an adjustable capacitance $C_1$, and
- a fixed capacitor having a fixed capacitance $C_2$, wherein an inter-resonator coupling coupled between resonators of the first and second fixed filter subsections is configured to be canceled based on values of $C_1$ and $C_2$ when the intrinsically-switched filter subsection is switched to the off state.

19. The filter of claim 18, wherein the first fixed filter subsection and the second fixed filter subsection are configured to provide respective bandstop responses when the intrinsically-switched filter subsection is switched off.

20. The filter of claim 18, wherein the intrinsically-switched filter subsection comprises a second inter-resonator coupling coupled between the first and second fixed filter subsections, the second inter-resonator coupling is configured to be canceled when an intrinsically-switched coupling section of the intrinsically-switched filter subsection is switched to the off state.

\* \* \* \* \*